United States Patent
Hsu

(10) Patent No.: US 8,067,930 B2
(45) Date of Patent: Nov. 29, 2011

(54) INPUT VOLTAGE DETECTING CIRCUIT AND POWER SUPPLY HAVING SUCH INPUT VOLTAGE DETECTING CIRCUIT

(75) Inventor: Wen-Kuan Hsu, Taoyuan Hsien (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 452 days.

(21) Appl. No.: 12/431,120

(22) Filed: Apr. 28, 2009

(65) Prior Publication Data

US 2010/0207664 A1 Aug. 19, 2010

(30) Foreign Application Priority Data

Feb. 13, 2009 (TW) ................................ 98104754 A

(51) Int. Cl.
*G05F 5/00* (2006.01)
(52) U.S. Cl. ........................................................ 323/299
(58) Field of Classification Search .................. 323/269, 323/276, 299, 303, 304, 311, 312, 318, 349; 327/530, 538
See application file for complete search history.

(56) References Cited

U.S. PATENT DOCUMENTS

| | | | | |
|---|---|---|---|---|
| 5,570,061 | A * | 10/1996 | Shimoda | 327/545 |
| 5,886,514 | A * | 3/1999 | Iguchi et al. | 323/299 |
| 6,166,527 | A * | 12/2000 | Dwelley et al. | 323/222 |
| 6,744,224 | B2 * | 6/2004 | Ishii | 315/291 |
| 7,149,609 | B2 * | 12/2006 | Hashimoto | 701/1 |
| 7,239,120 | B2 * | 7/2007 | Adragna et al. | 323/285 |
| 7,292,013 | B1 * | 11/2007 | Chen et al. | 323/222 |
| 7,768,247 | B2 * | 8/2010 | Sasaki et al. | 323/299 |
| 2007/0290668 | A1 * | 12/2007 | Chou et al. | 323/299 |
| 2009/0261789 | A1 * | 10/2009 | Chang et al. | 323/234 |

* cited by examiner

Primary Examiner — Adolf Berhane
(74) Attorney, Agent, or Firm — Kirton & McConkie; Evan R. Witt

(57) ABSTRACT

An input voltage detecting circuit includes an input circuit, a signal processing circuit and an output circuit. The input circuit is used for processing the intensity and the waveform of an input voltage, thereby generating a first signal, wherein the first signal and the input voltage have similar time sequences. The signal processing circuit is connected to the input circuit for reducing a first delaying time of the first signal, thereby generating a second signal having a second delaying time shorter than the first delaying time. The output circuit is connected to the signal processing circuit for processing the intensity and the waveform of the second signal, thereby generating the power status signal. If the input voltage is uninterrupted, the power status signal is in an uninterrupted status. If the input voltage is interrupted, the power status signal is in an interrupted status.

20 Claims, 8 Drawing Sheets

INPUT VOLTAGE DETECTING CIRCUIT AND POWER SUPPLY HAVING SUCH INPUT VOLTAGE DETECTING CIRCUIT

FIELD OF THE INVENTION

The present invention relates to a detecting circuit, and more particularly to an input voltage detecting circuit. The present invention also relates to a power supply having such an input voltage detecting circuit.

BACKGROUND OF THE INVENTION

With increasing industrial development, diverse electronic devices are used to achieve various purposes. An electronic device comprises a plurality of electronic components. Generally, different kinds of electronic components are operated by using different voltages.

As known, a power supply is essential for many electronic devices such as personal computers, industrial computers, servers, communication products or network products. Usually, the user may simply plug a connector of a power supply into an AC wall outlet commonly found in most homes or offices so as to receive an AC voltage. The power supply will convert the AC voltage into a regulated DC output voltage for powering the electronic device. The regulated DC output voltage is transmitted to the electronic device through a power cable.

FIG. 1 is a schematic block diagram illustrating the connection between a power supply and a system circuit of an electronic device according to the prior art. As shown in FIG. 1, the power supply 11 includes a power converting circuit 111 and an input capacitor $C_x$. The input capacitor $C_x$ is connected to the input terminal of the power converting circuit 111 for suppressing electromagnetic interference (EMI). The output terminal of the power converting circuit 111 is connected to the system circuit 12. By the power converting circuit 111, the electric energy of an input voltage $V_{in}$ is received and converted into an output voltage $V_o$ for powering the system circuit 12. If the input voltage $V_{in}$ is suffered from sudden interruption, the power converting circuit 111 fails to continuously provide the output voltage $V_o$ to the system circuit 12. If no proper measures (for example saving the game's progress of a game console, saving the operating data of the computer and reducing the bulb temperature of a projector) are taken before the electronic device 1 is turned off, some important data stored in the electronic device 1 are possibly lost and the electronic device 1 fails to be normally turned on or normally operated again. In other words, a prerequisite procedure should be done before the electronic device 1 is turned off.

For providing a sufficient time period to perform the prerequisite procedure, an input voltage detecting circuit is used to detect the magnitude of the input voltage $V_{in}$. If the input voltage $V_{in}$ is suffered from interruption, the input voltage detecting circuit will issue a power status signal. According to the power status signal, the electronic device 1 performs the prerequisite procedure.

FIG. 2 is a timing waveform diagram schematically illustrating the corresponding voltage signals processed in a conventional input voltage detecting circuit. In a case that the input voltage $V_{in}$ is suffered from interruption at the first time spot $t_1$, the discharging period of the input capacitor $C_x$ is too long and the magnitude of the input voltage $V_{in}$ is decreased at a slow rate, because the capacitance value of the input capacitor $C_x$ and the impedance at the input terminal of the power converting circuit 111 are very large. In addition, since the conventional input voltage detecting circuit (not shown) is very simple, its response to the interruption of the input voltage $V_{in}$ is very slow. Until the magnitude of the input voltage $V_{in}$ is lowered than a reference voltage at the second time spot $t_2$, the conventional input voltage detecting circuit may discriminate that the input voltage $V_{in}$ is suffered from interruption. At the same time, a power status signal $V_k$ generated by the input voltage detecting circuit is at a high-level status, meaning that the input voltage $V_{in}$ is interrupted.

Since the power status signal $V_k$ indicative of interruption of the input voltage $V_{in}$ is generated after the input voltage $V_{in}$ has been suffered from interruption for a delaying time $T_d$, the user fails to realize the timing of performing the prerequisite procedure before the electronic device 1 is turned off. In other words, the conventional input voltage detecting circuit is not feasible to the power supply 11.

There is a need of providing an improved input voltage detecting circuit so as to obviate the drawbacks encountered from the prior art.

SUMMARY OF THE INVENTION

The present invention provides an input voltage detecting circuit of the present invention capable of quickly discriminating whether the input voltage is suddenly interrupted, so that the user has sufficient time to perform the prerequisite procedure before the electronic device is turned off.

In accordance with an aspect of the present invention, there is provided an input voltage detecting circuit for detecting an input voltage and generating a power status signal according to the input voltage. The input voltage detecting circuit includes an input circuit, a signal processing circuit and an output circuit. The input circuit is used for processing the intensity and the waveform of the input voltage, thereby generating a first signal, wherein the first signal and the input voltage have similar time sequences. The signal processing circuit is connected to the input circuit for reducing a first delaying time of the first signal, thereby generating a second signal having a second delaying time shorter than the first delaying time. The output circuit is connected to the signal processing circuit for processing the intensity and the waveform of the second signal, thereby generating the power status signal. If the input voltage is uninterrupted, the power status signal is in an uninterrupted status. If the input voltage is interrupted, the power status signal is in an interrupted status.

In accordance with another aspect of the present invention, there is provided a power supply for proving an output voltage and a power status signal to a system circuit. The power supply includes a power converting circuit, an input capacitor and an input voltage detecting circuit. The power converting circuit is connected to the system circuit for converting an input voltage into the output voltage so as to power the system circuit. The input capacitor is connected to an input terminal of the power converting circuit. The input voltage detecting circuit is interconnected between the input terminal of the power converting circuit and the system circuit for detecting the input voltage and generating a power status signal according to the input voltage. The input voltage detecting circuit includes an input circuit, a signal processing circuit and an output circuit. The input circuit is used for processing the intensity and the waveform of the input voltage, thereby generating a first signal, wherein the first signal and the input voltage have similar time sequences. The signal processing circuit is connected to the input circuit for reducing a first delaying time of the first signal, thereby generating a second signal having a second delaying time shorter than the first delaying time. The output circuit is connected to the signal processing circuit for processing the intensity and the waveform of the second signal, thereby generating the power status signal. If the input voltage is uninterrupted, the power status signal is in an uninterrupted status. If the input voltage is interrupted, the power status signal is in an interrupted status.

The above contents of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
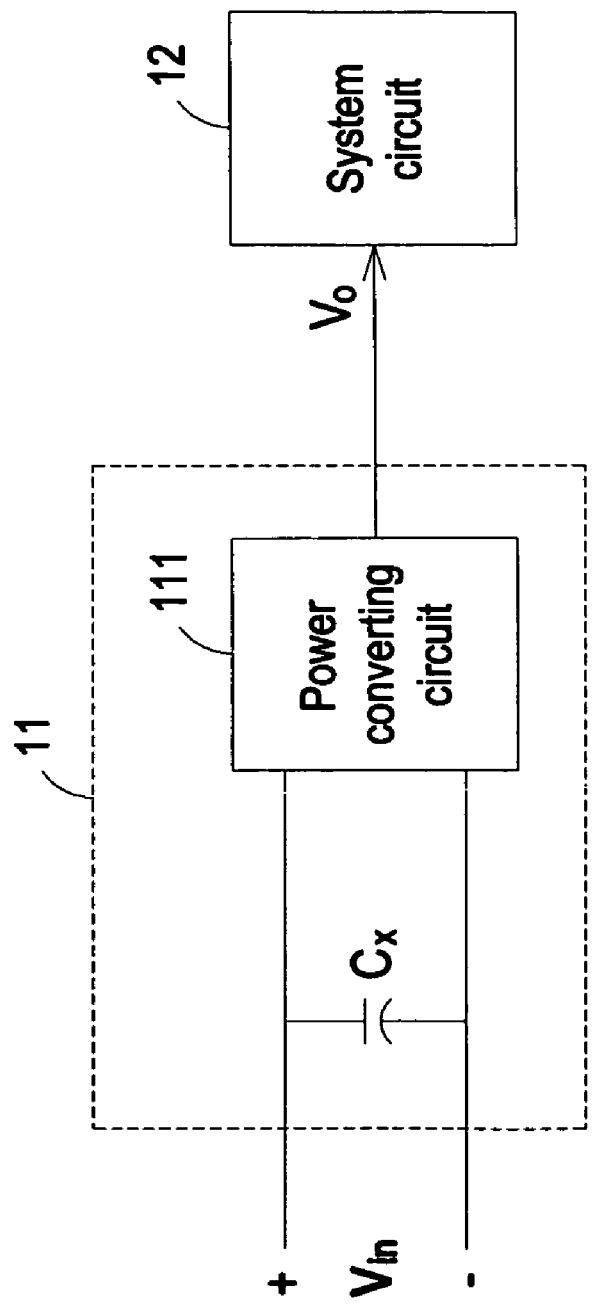
FIG. 1 is a schematic block diagram illustrating the connection between a power supply and a system circuit of an electronic device according to the prior art.
Figure 2:
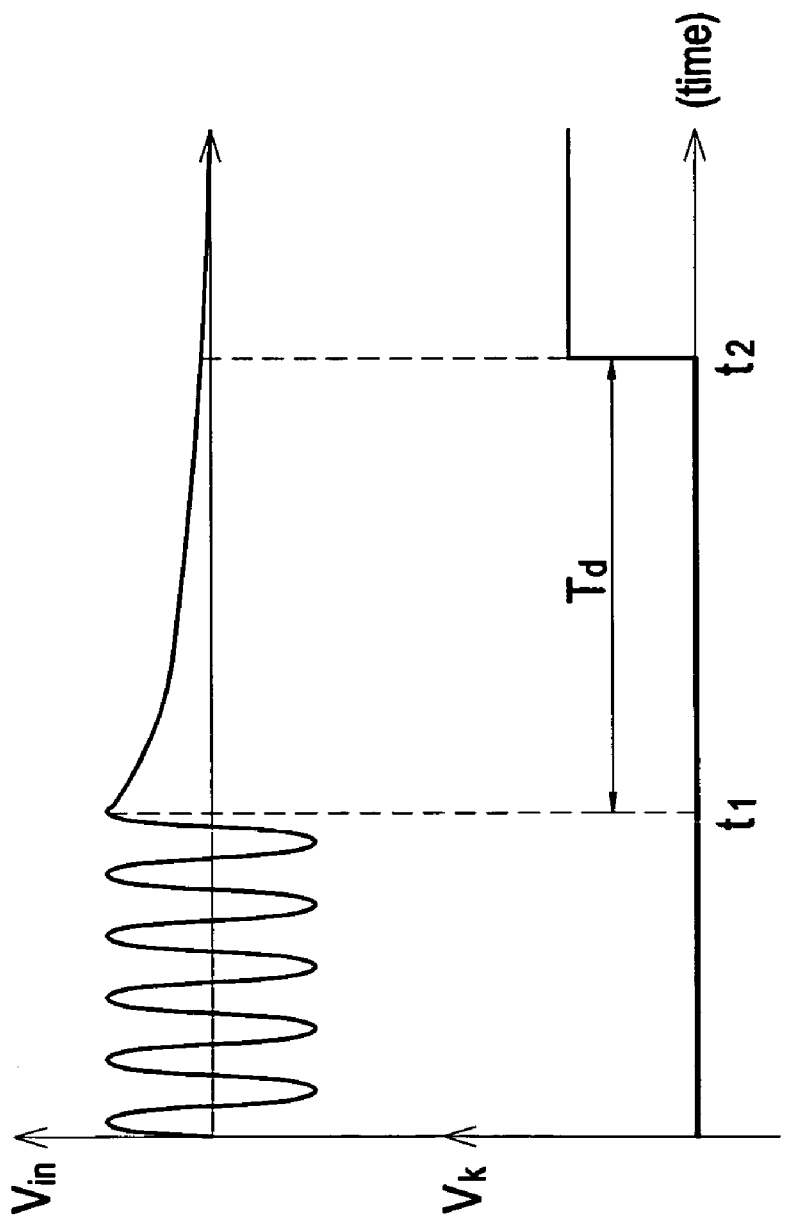
FIG. 2 is a timing waveform diagram schematically illustrating the corresponding voltage signals processed in a conventional input voltage detecting circuit.
Figure 3:
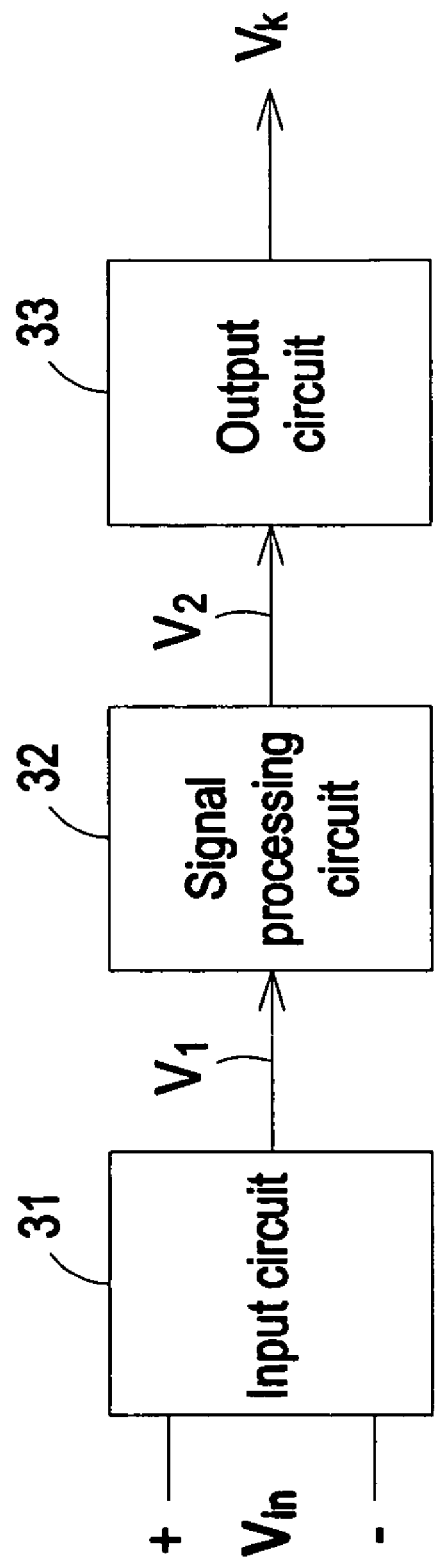
FIG. 3 is a schematic block diagram illustrating input voltage detecting circuit according to an embodiment of the present invention.

FIG. 3 is a schematic block diagram illustrating input voltage detecting circuit according to an embodiment of the present invention. The input voltage detecting circuit 3 is used for discriminating whether the input voltage $V_{in}$ is suffered from interruption and generating a power status signal $V_k$ according to the input voltage $V_{in}$. As shown in FIG. 3, the input voltage detecting circuit 3 principally comprises an input circuit 31, a signal processing circuit 32 and an output circuit 33. The output terminal of the input circuit 31 is connected to the input terminal of the signal processing circuit 32. The intensity and the waveform of the input voltage $V_{in}$ are processed by the input circuit 31 into a first signal $V_1$. The time sequence of the first signal $V_1$ and the time sequence of the input voltage $V_{in}$ are similar. The signal processing circuit 32 is interconnected between the input circuit 31 and the output circuit 33 for reducing a first delaying time $T_{d1}$ of the first signal $V_1$, thereby generating a second signal $V_2$. The input terminal of the output circuit 33 is connected to the output terminal of the signal processing circuit 32. The intensity and the waveform of the second signal $V_2$ are processed by the output circuit 33 into the power status signal $V_k$.

Figure 4:
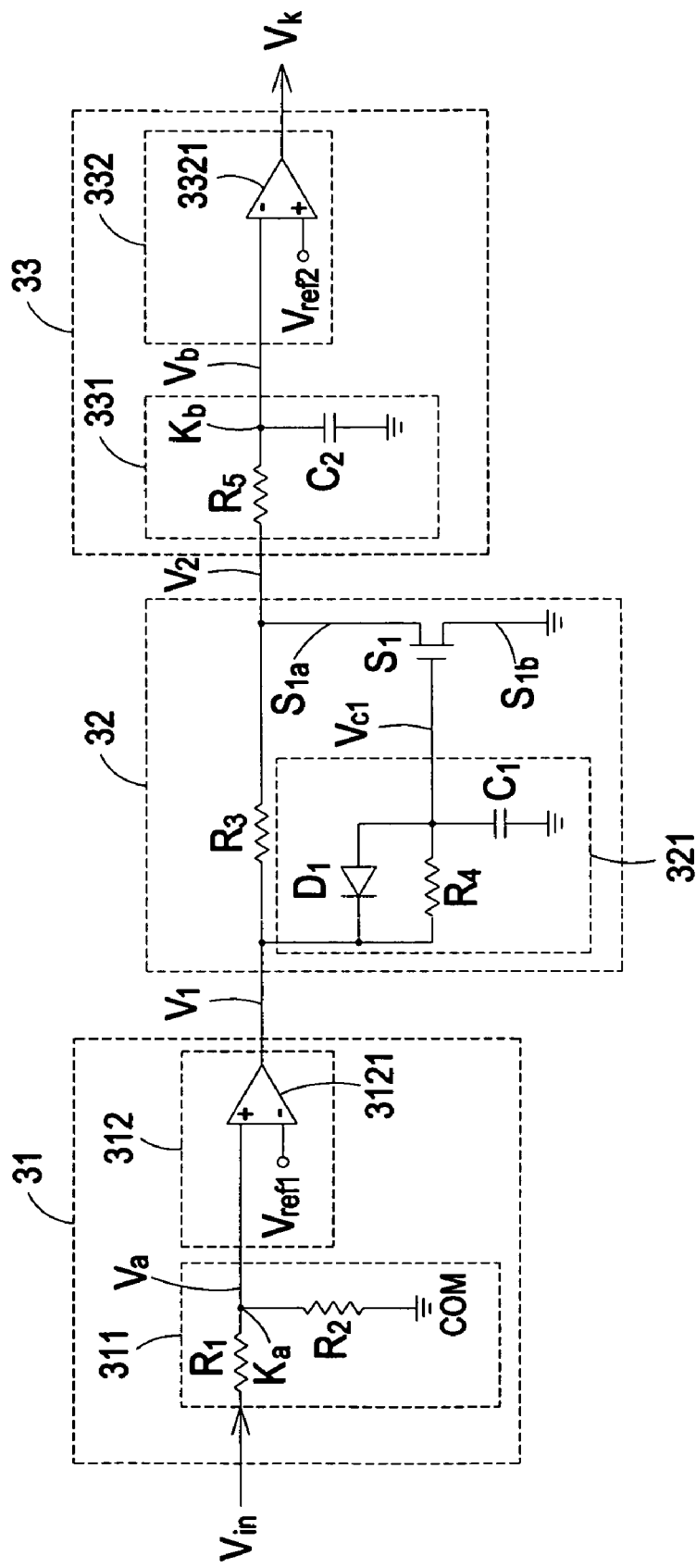
FIG. 4 is a schematic detailed circuit diagram illustrating an exemplary input voltage detecting circuit of FIG. 3.

FIG. 4 is a schematic detailed circuit diagram illustrating an exemplary input voltage detecting circuit of FIG. 3. The input circuit 31 includes a voltage divider 311 and a first signal converting circuit 312. The divider node $K_a$ of the voltage divider 311 is connected to the input terminal of the first signal converting circuit 312. The input voltage $V_{in}$ is subject to voltage division by the voltage divider 311 and thus the voltage divider 311 generates a divided voltage $V_a$ having a lower intensity than the input voltage $V_{in}$. The first signal converting circuit 312 is interconnected between the input terminal of the signal processing circuit 32 and the divider node $K_a$ of the voltage divider 311. The divided voltage $V_a$, whose intensity and waveform are similar to the input voltage $V_{in}$, is processed by the first signal converting circuit 312 into the first signal $V_1$.

The voltage divider 311 includes a first resistor $R_1$ and a second resistor $R_2$. An end of the first resistor $R_1$ receives the input voltage $V_{in}$. The other end of the first resistor $R_1$ is connected to the divider node $K_a$. An end of the second resistor $R_2$ is connected to the divider node $K_a$. The other end of the second resistor $R_2$ is to a common terminal COM.

In this embodiment, the first signal converting circuit 312 includes a first comparator 3121. The positive terminal of the first comparator 3121 is connected to the divider node $K_a$ of the voltage divider 311. The negative terminal of the first comparator 3121 receives a first reference voltage $V_{ref1}$. By comparing the divided voltage $V_a$ with the first reference voltage $V_{ref1}$, the waveform of the divided voltage $V_a$ is processed by the first comparator 3121, thereby generating the first signal $V_1$.

The signal processing circuit 32 includes a third resistor $R_3$, a fourth resistor $R_4$, a first diode $D_1$, a first capacitor $C_1$ and a first switch $S_1$. The third resistor $R_3$ is interconnected between the output terminal of the input circuit 31 and the input terminal of the output circuit 33. A first terminal $S_{1a}$ of the first switch $S_1$ is connected to an end of the third resistor $R_3$. A second terminal $S_{1b}$ of the first switch $S_1$ is connected to the common terminal COM. The fourth resistor $R_4$, the first diode $D_1$ and the first capacitor $C_1$ are collectively defined as a control signal generator 321. According to a control signal $V_{c1}$ generated by the control signal generator 321, the first switch $S_1$ is selectively conducted or shut off. The cathode of the first diode $D_1$ is connected to the other end of the third resistor $R_3$. The anode of the first diode $D_1$ is connected to the control terminal of the first switch $S_1$. The fourth resistor $R_4$ is connected with the first diode $D_1$ in parallel. The first capacitor $C_1$ is interconnected between the control terminal of the first switch $S_1$ and the common terminal COM. An example of the first switch $S_1$ includes but is not limited to a metal oxide semiconductor field effect transistor (MOSFET) or a bipolar junction transistor (BJT).

The output circuit 33 includes a filter circuit 331 and a second signal converting circuit 332. The input terminal of the filter circuit 331 is connected to the output terminal of the signal processing circuit 32. The filter node $K_b$ of the filter circuit 331 is connected to the input terminal of the second signal converting circuit 332. The filter circuit 331 is used for filtering the second signal $V_2$, thereby generating a filtered voltage $V_b$. The input terminal of the second signal converting circuit 332 is connected to the filter node $K_b$ of the filter circuit 331. The filtered voltage $V_b$, which has a time sequence similar to the second signal $V_2$, is processed by the second signal converting circuit 332, thereby generating the power status signal $V_k$.

The filter circuit 331 includes a fifth resistor $R_5$ and a second capacitor $C_2$. An end of the fifth resistor $R_5$ is connected to the filter node $K_b$ and the input terminal of the second signal converting circuit 332. The other end of the fifth resistor $R_5$ is connected to the output terminal of the signal processing circuit 32. The second capacitor $C_2$ is interconnected between the filter node $K_b$ and the common terminal COM.

In this embodiment, the second signal converting circuit 332 includes a second comparator 3321. The negative terminal of the second comparator 3321 is connected to the filter node $K_b$ of the filter circuit 331. The positive terminal of the second comparator 3321 receives a second reference voltage $V_{ref2}$. By comparing the filtered voltage $V_b$ with the second reference voltage $V_{ref2}$, the second comparator 3321 generates the power status signal $V_k$.

Figure 5:
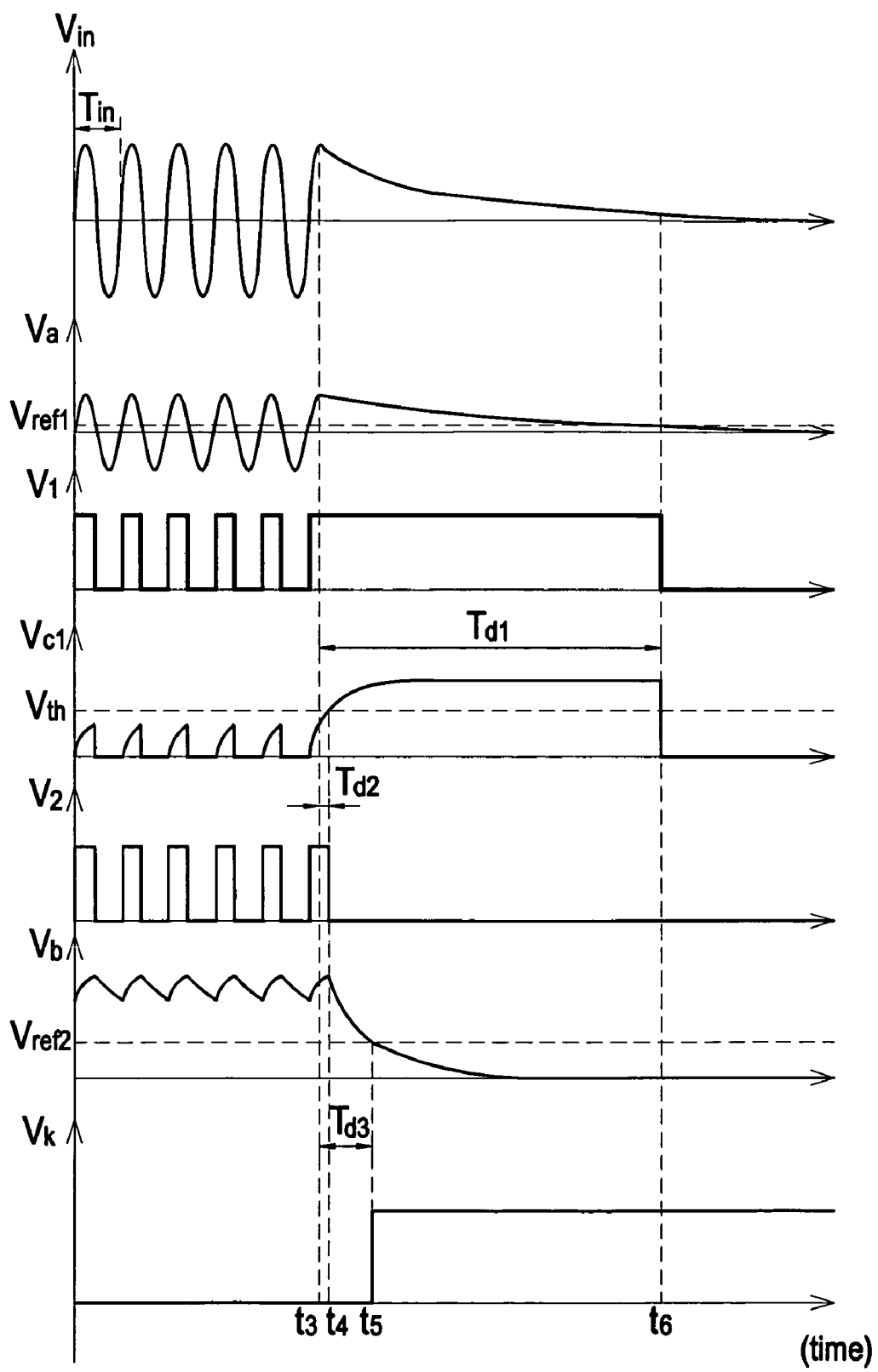
FIG. 5 is a timing waveform diagram schematically illustrating the corresponding voltage signals processed in the input voltage detecting circuit shown in FIG. 4.

FIG. 5 is a timing waveform diagram schematically illustrating the corresponding voltage signals processed in the input voltage detecting circuit shown in FIG. 4. Before the third time spot $t_3$, the input voltage $V_{in}$ and the divided voltage $V_a$ are both sine waves, wherein the cycle period $T_{in}$ of the input voltage $V_{in}$ is the same as that of the divided voltage $V_a$ but the intensity of the divided voltage $V_a$ is lower than the input voltage $V_{in}$. At the third time spot $t_3$, the input voltage $V_{in}$ is suffered from interruption, and thus the magnitudes of the input voltage $V_{in}$ and the divided voltage $V_a$ are decreased at a slow rate. The first signal $V_1$ is generated by the first comparator 3121 according to the divided voltage $V_a$ and the first reference voltage $V_{ref1}$. If the divided voltage $V_a$ is greater than the first reference voltage $V_{ref1}$, the first signal $V_1$ is at a high-level status. Whereas, if the divided voltage $V_a$ is smaller than the first reference voltage $V_{ref1}$, the first signal $V_1$ is at a low-level status. In other word, the waveform of the divided voltage $V_a$ is changed into the rectangular wave of the first signal $V_1$, wherein the time sequence of the first signal $V_1$ and the time sequence of the input voltage $V_{in}$ are similar.

According to the first signal $V_1$, the first capacitor $C_1$ of the control signal generator 321 is charged or discharges electricity so as to generate the control signal $V_{c1}$. In a case that the first signal $V_1$ is at the high-level status, the electricity of the first signal $V_1$ is transmitted to the first capacitor $C_1$ through the fourth resistor $R_4$ so as to charge the first capacitor $C_1$. Whereas, in a case that the first signal $V_1$ is at the low-level status, the electrical energy stored in the first capacitor $C_1$ discharges electricity through the first diode $D_1$. Since charging path of the first capacitor $C_1$ passes through the fourth resistor $R_4$ and the discharging path of the first capacitor $C_1$ passes through the first diode $D_1$ with low resistive property, the first capacitor $C_1$ is charged at a slow rate but discharges at a rapid rate. In addition, the magnitude of the control signal $V_{c1}$ fails to exceed the conducting threshold value $V_{th}$ of the first switch $S_1$ during a half of the cycle period $T_{in}$ of the input voltage $V_{in}$. Since the magnitude of the control signal $V_{c1}$ is smaller than the conducting threshold value $V_{th}$ before the third time spot $t_3$, the first switch $S_1$ is shut off.

After the third time spot $t_3$, the magnitude of the input voltage $V_{in}$ is gradually decreased such that the duration of the first signal $V_1$ at the high-level status is longer than a half of the cycle period $T_{in}$ of the input voltage $V_{in}$. As such, there is sufficient time for charging the first capacitor $C_1$. At the fourth time spot $t_4$, the magnitude of the control signal $V_{c1}$ reaches conducting threshold value $V_{th}$ of the first switch $S_1$, and thus the first switch $S_1$ is conducted.

Since the third resistor $R_3$ is interconnected between the input terminal and the output terminal of the signal processing circuit 32, the waveform and the time sequence of the second signal $V_2$ are similar to those of the first signal $V_1$ when the first switch $S_1$ is shut off. When the first switch $S_1$ is conducted, the second signal $V_2$ is at a low-level status as the common terminal COM. That is, before the fourth time spot $t_4$, the first switch $S_1$ is shut off and thus the waveform and the time sequence of the second signal $V_2$ are similar to those of the first signal $V_1$. After the fourth time spot $t_4$, the first switch $S_1$ is conducted and thus the second signal $V_2$ is at a low-level status as the common terminal COM.

Although the magnitudes of the input voltage $V_{in}$ and the divided voltage $V_a$ are decreased at a slow rate after the input voltage $V_{in}$ is suffered from interruption, the magnitude of the divided voltage $V_a$ is lower than the first reference voltage $V_{ref1}$ until the sixth time spot $t_6$. In other words, the first signal $V_1$ has a very long first delaying time $T_{d1}$. Since the first switch $S_1$ of the signal processing circuit 32 is conducted at the fourth time spot $t_4$, the first delaying time $T_{d1}$ of the first signal $V_1$ is reduced and thus the second signal $V_2$ generated by the signal processing circuit 32 has a second delaying time $T_{d2}$, which is shorter than the delaying time $T_{d1}$.

Moreover, the high-frequency components contained in the second signal $V_2$ are filtered off by the low-pass filter circuit that is collectively defined by the fifth resistor $R_5$ and the second capacitor $C_2$, thereby generating the filtered voltage $V_b$. As a consequence, the filtered voltage $V_b$ has a time sequence similar to the second signal $V_2$. Since the power status signal $V_k$ is generated by the second comparator 3321 according to the filtered voltage $V_b$, power status signal $V_k$ has a third delaying time $T_{d3}$, which is also shorter than the first delaying time $T_{d1}$. Before the fifth time spot $t_5$, the filtered voltage $V_b$ is greater than the second reference voltage $V_{ref2}$, and the power status signal $V_k$ generated by the second comparator 3321 is in an uninterrupted status indicating that the input voltage $V_{in}$ is uninterrupted. After the fifth time spot $t_5$, the filtered voltage $V_b$ is smaller than the second reference voltage $V_{ref2}$, and the power status signal $V_k$ generated by the second comparator 3321 is in an interrupted status indicating that the input voltage $V_{in}$ is interrupted.

In this embodiment, the interrupted status and the uninterrupted status of the power status signal $V_k$ are a high-level status and a low-level status, respectively. In some embodiments, the positive terminal of the second comparator 3321 is connected to the filter node $K_b$ of the filter circuit 331 and the negative terminal of the second comparator 3321 receives the second reference voltage $V_{ref2}$. By comparing the filtered voltage $V_b$ with the second reference voltage $V_{ref2}$, the second comparator 3321 generates the power status signal $V_k$. Under this circumstance, the interrupted status and the uninterrupted status of the power status signal $V_k$ are a low-level status and a high-level status, respectively.

Figure 6:
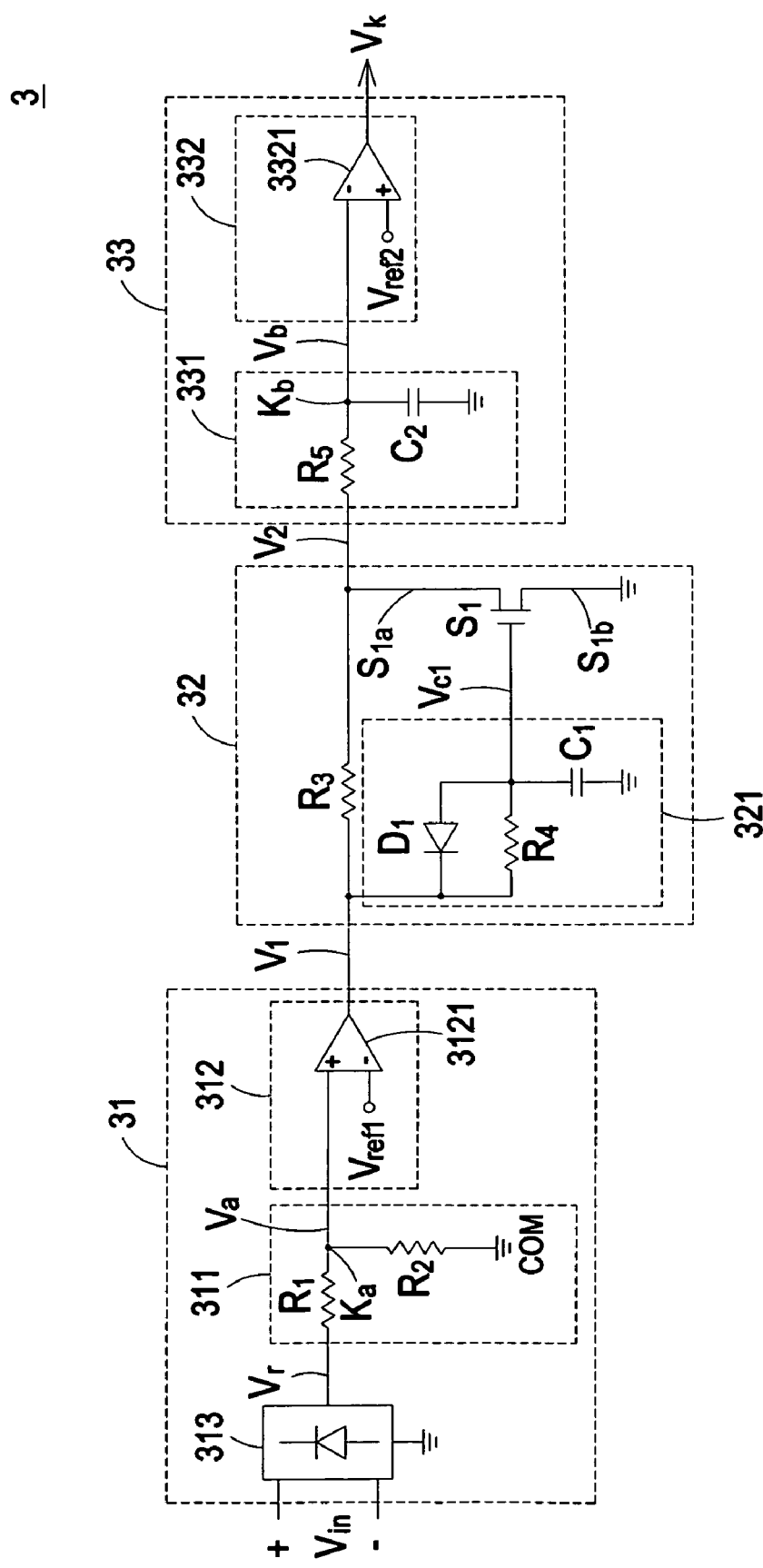
FIG. 6 is a schematic detailed circuit diagram illustrating another exemplary input voltage detecting circuit of FIG. 3.

FIG. 6 is a schematic detailed circuit diagram illustrating another exemplary input voltage detecting circuit of FIG. 3. In comparison with FIG. 4, the input circuit 31 of the input voltage detecting circuit 3 of FIG. 6 includes the voltage divider 311, the first signal converting circuit 312 and a rectifier circuit 313. The rectifier circuit 313 is interconnected between the input voltage $V_{in}$ and the input terminal of the voltage divider 311 for rectifying the input voltage $V_{in}$, thereby generating a rectified input voltage $V_r$. The rectified input voltage $V_r$ is subject to voltage division by the voltage divider 311 and thus the voltage divider 311 generates a divided voltage $V_a$ having a lower intensity than the input voltage $V_{in}$. An example of the rectifier circuit 313 includes but is not limited to a full-wave rectifier circuit or a half-wave rectifier circuit. The operation principles and the configurations of other circuits included in FIG. 6 are identical to those shown in FIG. 4, and are not redundantly described herein.

Figure 7:
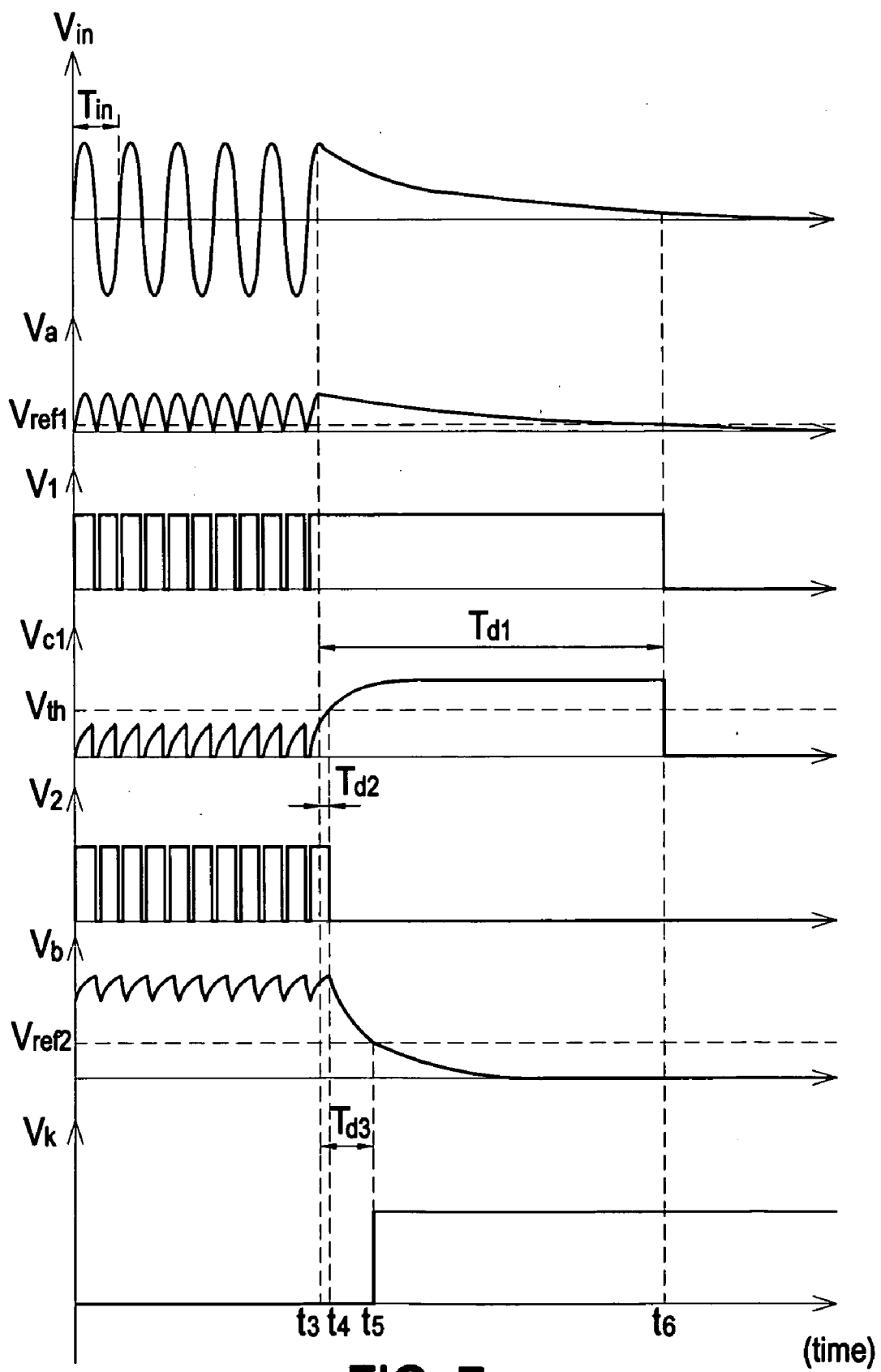
FIG. 7 is a timing waveform diagram schematically illustrating the corresponding voltage signals processed in the input voltage detecting circuit shown in FIG. 6.

FIG. 7 is a timing waveform diagram schematically illustrating the corresponding voltage signals processed in the input voltage detecting circuit shown in FIG. 6. In comparison with FIG. 5, the divided voltage $V_a$ is distinguished. Since the input circuit 31 of FIG. 6 can reduce the intensity of the input voltage $V_{in}$ and rectify the input voltage $V_{in}$, the waveform of the divided voltage $V_a$ shown in FIG. 7 is a rectified and intensity-reduced waveform of the input voltage $V_{in}$. Similarly, the waveform of the divided voltage $V_a$ is changed into the rectangular wave of the first signal $V_1$, wherein the time sequence of the first signal $V_1$ and the time sequence of the input voltage $V_{in}$ are similar. The relations between the first signal $V_1$, the control signal $V_{c1}$, the second signal $V_2$, the filtered voltage $V_b$ and the power status signal $V_k$ are identical to those shown in FIG. 5, and are not redundantly described herein.

From the above description, the first delaying time $T_{d1}$ is much larger than the cycle period $T_{in}$ of the input voltage $V_{in}$. By the signal processing circuit 32 of the input voltage detecting circuit 3, the first delaying time $T_{d1}$ is reduced such that the difference between the first delaying time $T_{d1}$ and the second delaying time $T_{d2}$ and the difference between the first delaying time $T_{d1}$ and the third delaying time $T_{d3}$ are longer than at least one cycle period $T_{in}$ of the input voltage $V_{in}$. Alternatively, the difference between the first delaying time $T_{d1}$ and the third delaying time $T_{d3}$ is shorter than one cycle period $T_{in}$ of the input voltage $V_{in}$.

Figure 8:
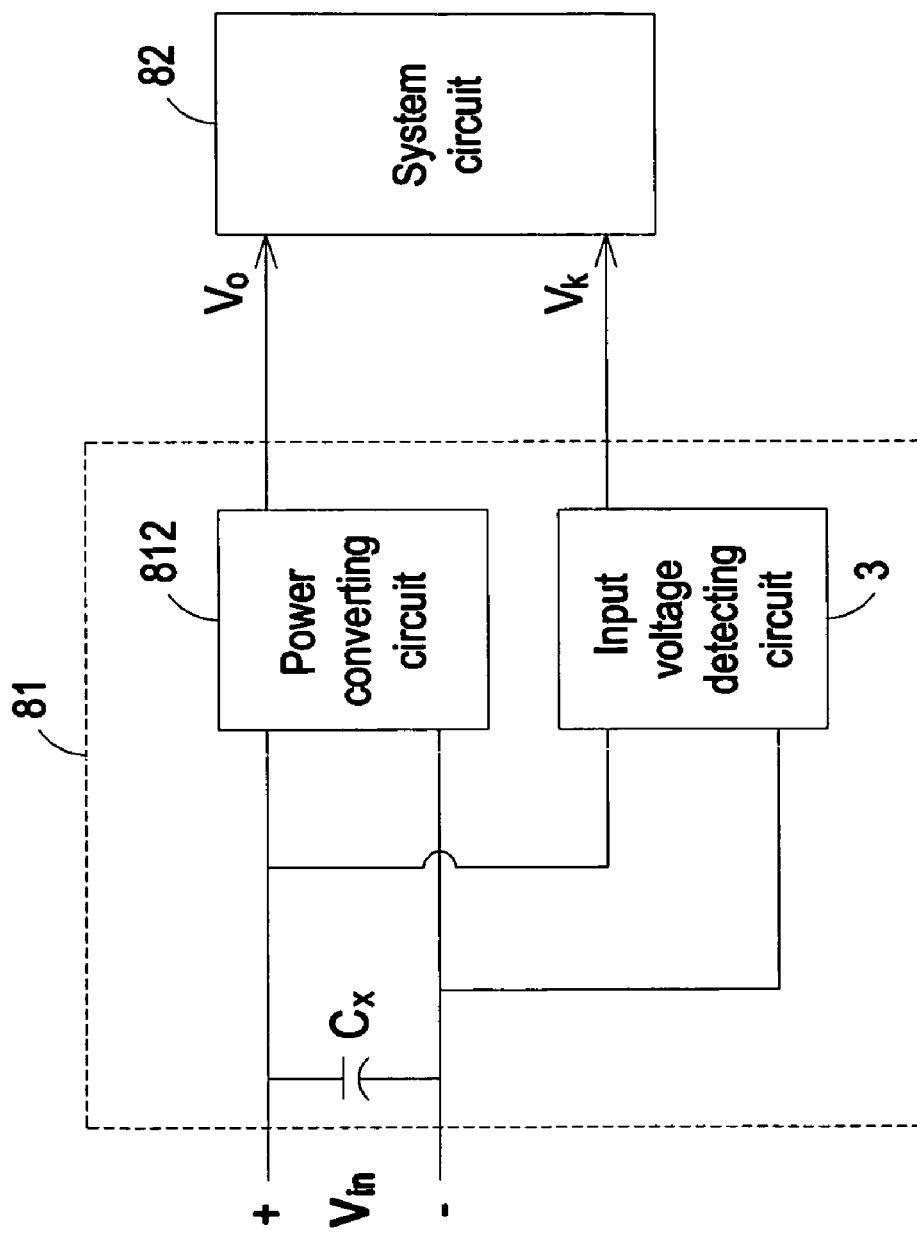
FIG. 8 is schematic block diagram illustrating a power supply having an input voltage detecting circuit of the present invention.

FIG. 8 is schematic block diagram illustrating a power supply having an input voltage detecting circuit of the present invention. The power supply 81 is used for powering a system circuit 82 of an electronic device 8. As shown in FIG. 8, the power supply 81 issues an output voltage $V_o$ and a power status signal $V_k$ to the system circuit 82. According to the power status signal $V_k$, a prerequisite procedure is done before the system circuit 82 is turned off.

The power supply 81 includes a power converting circuit 812, an input capacitor $C_x$ and the input voltage detecting circuit 3 of the present invention. The output terminal of the power converting circuit 812 is connected to the system circuit 82. The input terminal of the power converting circuit 812 is connected to the input terminal of the input voltage detecting circuit 3 and the input capacitor $C_x$. By the power converting circuit 812, the electric energy of an input voltage $V_{in}$ is received and converted into the output voltage $V_o$ for powering the system circuit 82. The input capacitor $C_x$ is connected to the input terminal of the power converting circuit 812 and the input terminal of the input voltage detecting circuit 3 for suppressing electromagnetic interference (EMI). The output terminal of the input voltage detecting circuit 3 is connected to the system circuit 82. The input terminal of the input voltage detecting circuit 3 is connected to the input terminal of the power converting circuit 812 and the input capacitor $C_x$. The input voltage detecting circuit 3 can discriminate whether the input voltage $V_{in}$ is interrupted. According to the input voltage $V_{in}$, the input voltage detecting circuit 3 generates the power status signal $V_k$.

If the input voltage $V_{in}$ is suffered from a sudden interruption, the output voltage $V_o$ generated by the power converting circuit 81 can be still maintained above the rated voltage for a holding time. After the holding time, the output voltage $V_o$ is lowered than the rated voltage and no electrical energy is transmitted to the system circuit 82.

Similarly, since the capacitance value of the input capacitor $C_x$ and the impedance at the input terminal of the power converting circuit 812 are very large, the discharging period of the input capacitor $C_x$ is too long if the input voltage $V_{in}$ is suddenly interrupted. Under this circumstance, the magnitude of the input voltage $V_{in}$ is decreased at a slow rate. Since the first delaying time $T_{d1}$ of the input voltage $V_{in}$ is reduced by the input voltage detecting circuit 3, the input voltage detecting circuit 3 can quickly generate the power status signal $V_k$ even if the input voltage $V_{in}$ is suddenly interrupted and the magnitude of the input voltage $V_{in}$ is decreased at a slow rate. According to the present invention, a sufficient time period is provided for performing the prerequisite procedure before the system circuit 82 is turned off. In other words, the input voltage detecting circuit 3 is operated at a high response rate.

The power converting circuit 812 of the power supply 81 may be implemented by a boost power converter, a buck power converter or a buck-boost power converter. In other words, no additional output capacitor having a large capacitance value needs to be arranged at the output terminal of the power converting circuit for extending the holding time, because the output voltage $V_o$ is maintained above the rated voltage for a holding time that is sufficient to perform the prerequisite procedure before the system circuit 82 is turned off.

Moreover, some circuits and electronic components of the input voltage detecting circuit 3 are powered by the power converting circuit 812. As such, if the input voltage $V_{in}$ is suddenly interrupted, the input voltage detecting circuit 3 is also normally operated during the holding time of the output voltage $V_o$. At the same time, the power status signal $V_k$ is in the interrupted status.

Please refer to FIG. 6 and FIG. 8 again. In some embodiments, the rectifier circuit 313 of the input voltage detecting circuit 3 may be integrated into the power converting circuit 812 in order to reduce the cost, circuitry complexity and volume of the power supply 81.

From the above description, the input voltage detecting circuit of the present invention is capable of quickly discriminating whether the input voltage is suddenly interrupted. As a consequence, the user has sufficient time to perform the prerequisite procedure before the electronic device is turned off. In addition, since a regular power converting circuit can be used in the power supply having the input voltage detecting circuit of the present invention, the power supply is cost-effective.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An input voltage detecting circuit for detecting an input voltage and generating a power status signal according to said input voltage, said input voltage detecting circuit comprising:
   an input circuit for processing the intensity and the waveform of said input voltage, thereby generating a first signal, wherein said first signal and said input voltage have similar time sequences;
   a signal processing circuit connected to said input circuit for reducing a first delaying time of said first signal, thereby generating a second signal having a second delaying time shorter than said first delaying time; and
   an output circuit connected to said signal processing circuit for processing the intensity and the waveform of said second signal, thereby generating said power status signal, wherein said power status signal is in an uninterrupted status if said input voltage is uninterrupted, and said power status signal is in an interrupted status if said input voltage is interrupted.

2. The input voltage detecting circuit according to claim 1 wherein said power status signal has a third delaying time shorter than said first delaying time.

3. The input voltage detecting circuit according to claim 1 wherein said input circuit includes:
   a voltage divider for converting said input voltage into a divided voltage, which has a lower intensity than said input voltage; and
   a first signal converting circuit interconnected between said signal processing circuit and said voltage divider for processing said divided voltage, thereby generating said first signal.

4. The input voltage detecting circuit according to claim 3 wherein said input circuit further includes a rectifier circuit interconnected between said input voltage and said voltage divider for rectifying said input voltage.

5. The input voltage detecting circuit according to claim 3 wherein said voltage divider includes:
a first resistor having an end connected to a divider node of said voltage divider; and
a second resistor having an end connected to said first resistor and said divider node of said voltage divider.

6. The input voltage detecting circuit according to claim 3 wherein said first signal converting circuit includes a first comparator for comparing said divided voltage with a first reference voltage, thereby generating said first signal.

7. The input voltage detecting circuit according to claim 1 wherein said signal processing circuit includes:
a third resistor interconnected between said input circuit and said output circuit;
a first switch connected to an end of said third resistor; and
a control signal generator connected to an control terminal of said first switch and the other end of said third resistor and generating a control signal according to said first signal, wherein said first switch is conducted or shut off according to said control signal, and the magnitude of said control signal exceeds a conducting threshold value of said first switch after said input voltage has been interrupted for said second delaying time.

8. The input voltage detecting circuit according to claim 7 wherein said control signal generator includes:
a first diode connected to the other end of said third resistor and a control terminal of said first switch;
a fourth resistor connected with said first diode in parallel; and
a first capacitor connected to said control terminal of said first switch, wherein said control signal is generated by using said first signal to charge said first capacitor and discharging said first capacitor.

9. The input voltage detecting circuit according to claim 1 wherein said output circuit includes:
a filter circuit connected to said signal processing circuit for filtering said second signal, thereby generating a filtered signal; and
a second signal converting circuit connected to said filter circuit for generating said power status signal according to said filtered signal.

10. The input voltage detecting circuit according to claim 9 wherein said filter circuit is a low-pass filter circuit.

11. A power supply for proving an output voltage and a power status signal to a system circuit, said power supply comprising:
a power converting circuit connected to said system circuit for converting an input voltage into said output voltage so as to power said system circuit;
an input capacitor connected to an input terminal of said power converting circuit; and
an input voltage detecting circuit interconnected between said input terminal of said power converting circuit and said system circuit for detecting said input voltage and generating a power status signal according to said input voltage, said input voltage detecting circuit comprising:
an input circuit for processing the intensity and the waveform of said input voltage, thereby generating a first signal, wherein said first signal and said input voltage have similar time sequences;
a signal processing circuit connected to said input circuit for reducing a first delaying time of said first signal, thereby generating a second signal having a second delaying time shorter than said first delaying time; and
an output circuit connected to said signal processing circuit for processing the intensity and the waveform of said second signal, thereby generating said power status signal, wherein said power status signal is in an uninterrupted status if said input voltage is uninterrupted, and said power status signal is in an interrupted status if said input voltage is interrupted.

12. The power supply according to claim 11 wherein said power status signal has a third delaying time shorter than said first delaying time.

13. The power supply according to claim 11 wherein said input circuit includes:
a voltage divider for converting said input voltage into a divided voltage, which has a lower intensity than said input voltage; and
a first signal converting circuit interconnected between said signal processing circuit and said voltage divider for processing said divided voltage, thereby generating said first signal.

14. The power supply according to claim 13 wherein said input circuit further includes a rectifier circuit interconnected between said input voltage and said voltage divider for rectifying said input voltage.

15. The power supply according to claim 13 wherein said voltage divider includes:
a first resistor having an end connected to a divider node of said voltage divider; and
a second resistor having an end connected to said first resistor and said divider node of said voltage divider.

16. The power supply according to claim 13 wherein said first signal converting circuit includes a first comparator for comparing said divided voltage with a first reference voltage, thereby generating said first signal.

17. The power supply according to claim 11 wherein said signal processing circuit includes:
a third resistor interconnected between said input circuit and said output circuit;
a first switch connected to an end of said third resistor; and
a control signal generator connected to an control terminal of said first switch and the other end of said third resistor and generating a control signal according to said first signal, wherein said first switch is conducted or shut off according to said control signal, and the magnitude of said control signal exceeds a conducting threshold value of said first switch after said input voltage has been interrupted for said second delaying time.

18. The power supply according to claim 17 wherein said control signal generator includes:
a first diode connected to the other end of said third resistor and a control terminal of said first switch;
a fourth resistor connected with said first diode in parallel; and
a first capacitor connected to said control terminal of said first switch, wherein said control signal is generated by using said first signal to charge said first capacitor and discharging said first capacitor.

19. The power supply according to claim 11 wherein said output circuit includes:
a filter circuit connected to said signal processing circuit for filtering said second signal, thereby generating a filtered signal; and
a second signal converting circuit connected to said filter circuit for generating said power status signal according to said filtered signal.

20. The power supply according to claim 19 wherein said filter circuit is a low-pass filter circuit.

* * * * *